United States Patent
Choi et al.

(10) Patent No.: US 10,285,258 B2
(45) Date of Patent: May 7, 2019

(54) SYSTEMS AND METHODS FOR PROVIDING ELECTROMAGNETIC INTERFERENCE (EMI) COMPARTMENT SHIELDING FOR COMPONENTS DISPOSED INSIDE OF SYSTEM ELECTRONIC PACKAGES

(71) Applicant: Avago Technologies General IP (Singapore) Pte. Ltd, Singapore (SG)

(72) Inventors: Deog-Soon Choi, Seoul (KR); Chang-Yul Cheon, Seoul (KR); Sang-Hwa Jung, Ansan (KR); Sung-Phyo Lim, GyeonGgi-do (KR); Ah Ron Lee, Seoul (KR)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/034,596

(22) Filed: Jul. 13, 2018

(65) Prior Publication Data
US 2018/0324940 A1    Nov. 8, 2018

Related U.S. Application Data

(63) Continuation of application No. 15/282,882, filed on Sep. 30, 2016, now Pat. No. 10,076,023.

(51) Int. Cl.
*H05K 1/02* (2006.01)
*H01F 27/36* (2006.01)

(52) U.S. Cl.
CPC ......... *H05K 1/0216* (2013.01); *H01F 27/362* (2013.01); *H05K 1/023* (2013.01); *H05K 2201/09972* (2013.01); *H05K 2201/1056* (2013.01); *H05K 2201/10287* (2013.01)

(58) Field of Classification Search
CPC .. H05K 1/0216; H05K 9/0024; H05K 9/0052; H05K 9/0081; H01F 27/362; H01L 23/60
See application file for complete search history.

(56) References Cited

U.S. PATENT DOCUMENTS

2015/0237713 A1 *   8/2015   Elsherbini ............. H01L 23/552
                                                             361/679.55

* cited by examiner

*Primary Examiner* — Hoa C Nguyen
*Assistant Examiner* — Amol H Patel

(57) ABSTRACT

A compartment EMI shield for use inside of a system module package is provided that comprises at least a first set of electrically-conductive wires that surrounds and extends over circuitry of the module package. Adjacent wires of the first set are spaced apart from one another by a predetermined distance selected to ensure that the compartment EMI shield attenuates a frequency or frequency range of interest. First and second ends of each of the wires are connected to an electrical ground structure. A length of each wire that is located in between the first and second ends of the respective wire extends above the circuitry and is spaced apart from the components of the circuitry so as not to be in contact with the components of the circuitry.

20 Claims, 15 Drawing Sheets

SYSTEMS AND METHODS FOR PROVIDING ELECTROMAGNETIC INTERFERENCE (EMI) COMPARTMENT SHIELDING FOR COMPONENTS DISPOSED INSIDE OF SYSTEM ELECTRONIC PACKAGES

CROSS-REFERENCE TO RELATED APPLICATIONS

The present application is a continuation application under 37 C.F.R. § 1.53(b) of U.S. patent application Ser. No. 15/282,882, filed on Sep. 30, 2016. Priority under 35 U.S.C. § 120 is claimed from U.S. patent application Ser. No. 15/282,882, and the entire disclosure of U.S. patent application Ser. No. 15/282,882 is specifically incorporated herein by reference.

TECHNICAL FIELD OF THE INVENTION

The invention relates to electromagnetic interference (EMI) shielding. More particularly, the invention relates to providing compartment EMI shielding for components that are contained within system electronic packages.

BACKGROUND OF THE INVENTION

A system-in-a-package (SiP) is a module package that contains a plurality of integrated circuit (IC) chips and/or other circuit components (e.g., transistors, capacitors, indictors and resistors) that are mounted on a system printed circuit board (PCB), which is also part of the SiP module package. Such module packages are commonly used in wireless devices, such as smart phones, for example. The module package typically includes a system epoxy molding compound (EMC) that encapsulates the IC chips and other circuit components. The module package typically also includes a system EMI shield for reducing EMI emission from the module package. The system EMI shield is typically a conformal EMI shield formed on the module package by using, for example, a metal sputtering process to form a metal coating that conforms to the outer surface of the system EMC.

While the system EMI shield is effective at reducing EMI emissions from the module package as a whole, it has no effect on EMI emissions within the module package. Some of the ICs and other circuit components contained within the module package comprise radio frequency (RF) functional blocks. These RF functional blocks emit EMI that can interfere with the operations of other RF functional blocks within the module package. For example, one of the IC chips of one of the RF functional blocks may be a multi-band power amplifier (PA) chip supporting different modes of operation (e.g., Code Division Multiple Access (CDMA), Universal Mobile Telecommunications System (UMTS), Long Term Evolution (LTE), and Global System for Communication (GSM)/Enhanced Data GSM Environment (EDGE)). Another of the IC chips of another of the RF functional blocks may be, for example, a multi-band low noise amplifier (LNA) chip capable of supporting different modes of operation.

Without suitable EMI shielding of these RF functional blocks from one another, EMI emitted from one RF functional block may detrimentally impact the operations of another RF functional block. One known EMI shielding solution that is used for this purpose is an electrically-conductive metal "can" that is placed over an RF functional block to reduce EMI emissions from the RF functional block. However, current trends to reduce the sizes of SiPs and/or to increase the amounts or types of functionality that are included in them have made the use of electrically-conductive metal cans impractical due to their size and due to space constraints of environments in which the SiPs are used (e.g., smart phones).

Accordingly, a need exists for a compartment EMI shielding solution that is effective at providing EMI shielding within a module package and that is efficient in terms of space utilization and costs.

STATEMENT REGARDING PRIOR DISCLOSURES BY THE INVENTORS UNDER 37 CFR 1.77(B)(6)

Embodiments of the compartment EMI shielding solution were disclosed in an article entitled "A Method of Partial Encapsulation with Conductive Material for Compartment EMI Shield" on Feb. 5, 2016 in IP.com. A copy of the article is submitted with an information disclosure statement that is being concurrently filed herewith. The publication is believed to fall under the exception of 35 U.S.C. § 102(B)(1) and is therefore believed not to constitute prior art.

DETAILED DESCRIPTION

Figure 1A:
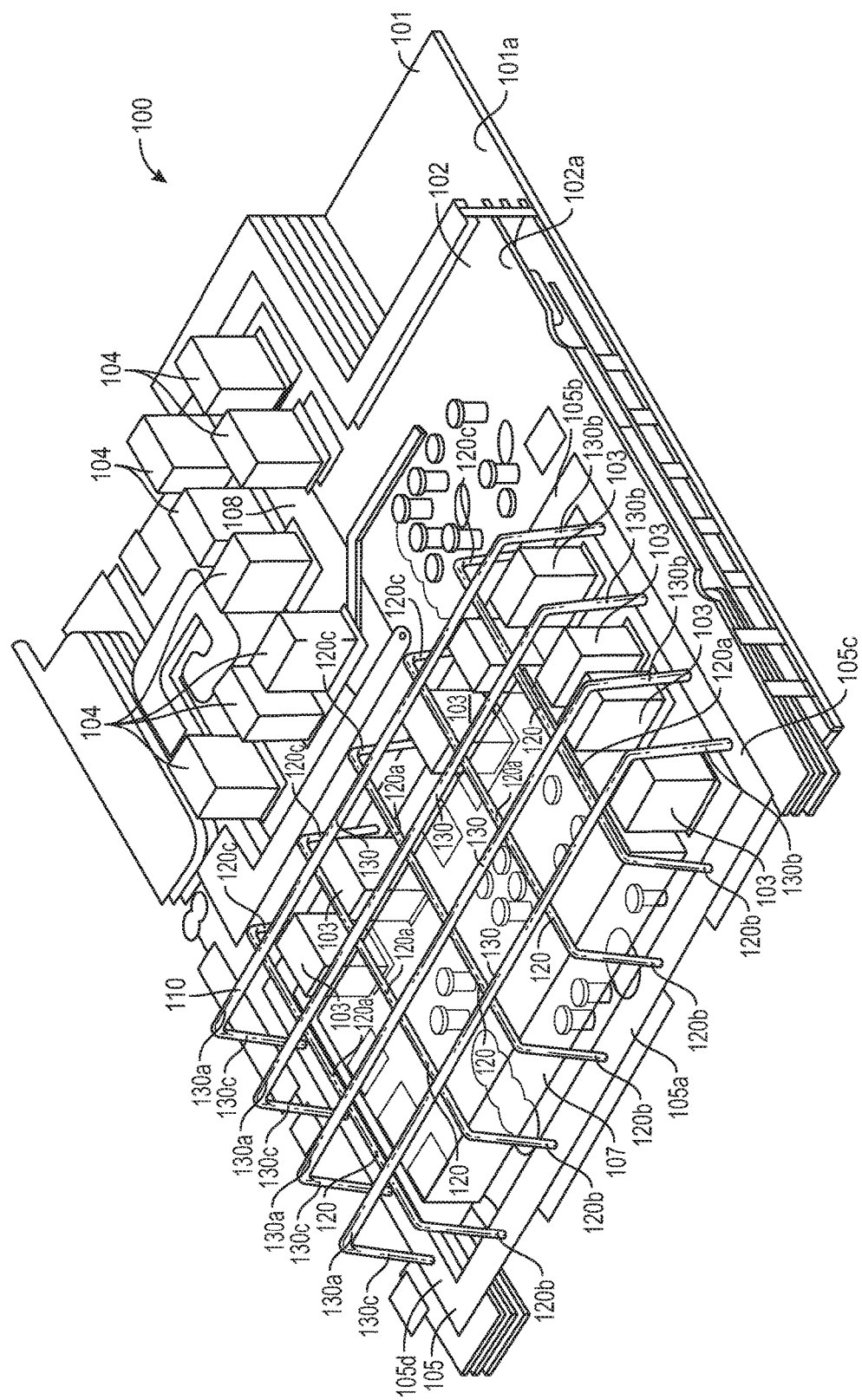
FIGS. 1A and 1B illustrate top perspective and top plan views, respectively, of a portion of an SiP module package having a compartment EMI shield in accordance with an exemplary embodiment.

In accordance with illustrative embodiments, compartment EMI shield for use inside of a system module package is provided that comprises at least a first set of electrically-conductive wires that surrounds and extends over circuitry comprising one or more electrical components of the module package. Adjacent wires of the first set are spaced apart from one another by a predetermined distance selected to ensure that the compartment EMI shield attenuates a frequency or frequency range of interest. First and second ends of each of the wires are connected to an electrical ground structure. A length of each wire that is located in between the first and second ends of the respective wire extends above the circuitry and is spaced apart from the component(s) of the circuitry so as not to be in contact with the component(s).

The one or more electrical components of the circuitry are mounted on a top surface of a PCB of the module package or on a top surface of a substrate that is mounted on the top surface of the system PCB. A common electrical ground structure extends about a periphery of the circuitry. The lengths of the wires of the first set that extend above the circuitry are substantially parallel to one another and lie in a plane that is substantially parallel to a plane in which the surface on which the one or more electrical components are mounted lies.

In accordance with an exemplary embodiment, the circuitry comprises a functional block that is rectangular in shape and has first, second third and fourth sides. Likewise, the common electrical ground structure that extends about the periphery of the functional block is rectangular in shape and has first, second, third and fourth portions. In accordance with this exemplary embodiment, the first and second sides of the functional block are substantially parallel to and opposite one another and the first and second portions of the common electrical ground structure are substantially parallel to and opposite one another. In accordance with this embodiment, the lengths of the wires of the first set that extend above the functional block are substantially perpendicular to the first and second sides of the functional block and to the first and second portions of the common electrical ground structure.

In accordance with another exemplary embodiment, the circuitry comprises a functional block that is rectangular in shape and has first, second third and fourth sides. Likewise, the common electrical ground structure is rectangular in shape and has first, second, third and fourth portions. In accordance with this exemplary embodiment, the first and second sides of the functional block are substantially perpendicular to one another and are connected end to end. Likewise, in accordance with this exemplary embodiment, the first and second portions of the common electrical ground structure are substantially perpendicular to one another and are connected end to end. In accordance with this embodiment, the lengths of the wires of the first set that extend above the functional block are at an acute angle to all sides of the functional block and to all portions of the common electrical ground structure.

In accordance with another exemplary embodiment, the compartment EMI shield comprises at least first and second sets of electrically-conductive wires. Each set of wires surrounds and extends over circuitry of the module package. Each wire of the first set has a first end that is connected to a first portion of the common electrical ground structure and has a second end that is connected to a second portion of the common electrical ground structure. Each wire of the second set has a first end that is connected to a third portion of the common electrical ground structure and a second end that is connected to a fourth portion of the common electrical ground structure. The first and second portions of the common electrical ground plane are substantially parallel to and opposite one another. The third and fourth portions of the common electrical ground plane are substantially parallel to and opposite one another and are at a no-zero-degree angle to the first and second portions. Thus, the lengths of the wires of the first set that extend over the circuitry are at a non-zero-degree angle to the lengths of wires of the second set that extend over the circuitry. Where adjacent wires of the first intersect adjacent wires of the second set, intersections exist that are bounded on first and second sides of the intersection by the adjacent wires of the first set and that are bounded on third and fourth sides of the intersection by the adjacent wires of the second set, where the first and second sides of the intersection are substantially parallel to one another and are at a non-zero-degree angle to the third and fourth sides of the intersection. Each intersection constitutes a gap of a predetermined size selected to ensure that the EMI shield attenuates a frequency or frequency range of interest.

In accordance with another exemplary embodiment, the compartment EMI shield includes a peripheral wire fence comprising a third set of electrically-conductive wires that extends about at least a portion of the periphery of the circuitry. Each wire of the third set has a first end that is connected to a location on the common electrical ground structure and a second end that is connected to an adjacent location on the common electrical ground structure. Each wire of the third set extends upwardly, away from where the first end of the wire connect to the portion of the common electrical ground structure, bends, and extends downwardly, toward where the second end of the wire connects to the portion of the electrical ground structure. The wires of the first set come into contact with respective wires of the peripheral wire fence. In embodiments in which the compartment EMI shield also includes the second set of wires, the wires of the second set also come into contact with respective wires of the peripheral wire fence. The peripheral wire fence improves the effectiveness of the compartment EMI shield and prevents the wires that extend over the circuitry from coming into contact with the component(s) of the circuitry.

Exemplary embodiments will now be described with reference to the figures, in which like reference numerals represent like components, elements or features. It should be noted that features, elements or components in the figures are not intended to be drawn to scale, emphasis being placed instead on demonstrating inventive principles and concepts.

In the following detailed description, for purposes of explanation and not limitation, exemplary, or representative, embodiments disclosing specific details are set forth in order to provide a thorough understanding of inventive principles and concepts. However, it will be apparent to one of ordinary skill in the art having the benefit of the present disclosure that other embodiments according to the present teachings that are not explicitly described or shown herein are within the scope of the appended claims. Moreover, descriptions of well-known apparatuses and methods may be omitted so as not to obscure the description of the exemplary embodiments. Such methods and apparatuses are clearly within the scope of the present teachings, as will be understood by those of skill in the art. It should also be understood that the word "example," as used herein, is intended to be non-exclusionary and non-limiting in nature. More particularly, the word "exemplary" as used herein indicates one among several examples, and it must be understood that no undue emphasis or preference is being directed to the particular example being described. It should also be understood that the word "exemplary," as used herein, is intended to be non-exclusionary and non-limiting in nature. More particularly, the word "exemplary," as used herein, indicates one among several examples, and no undue emphasis or preference is being directed to the particular example being described.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a," "an" and "the" include both singular and plural referents, unless the context clearly dictates otherwise. Thus, for example, "a device" includes one device and plural devices. The terms "substantial" or "substantially" mean to within acceptable limits or degrees acceptable to those of skill in the art. For example, the term "substantially parallel to" means that a structure or device may not be made perfectly parallel to some other structure or device due to tolerances or imperfections in the process by which the structures or devices are made. The term "approximately" means to within an acceptable limit or amount to one of ordinary skill in the art. Relative terms, such as "over," "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

Exemplary embodiments will now be described with reference to the figures, in which like reference numerals represent like components, elements or features. It should be noted that features, elements or components in the figures are not intended to be drawn to scale, emphasis being placed instead on demonstrating inventive principles and concepts.

Figure 1B:
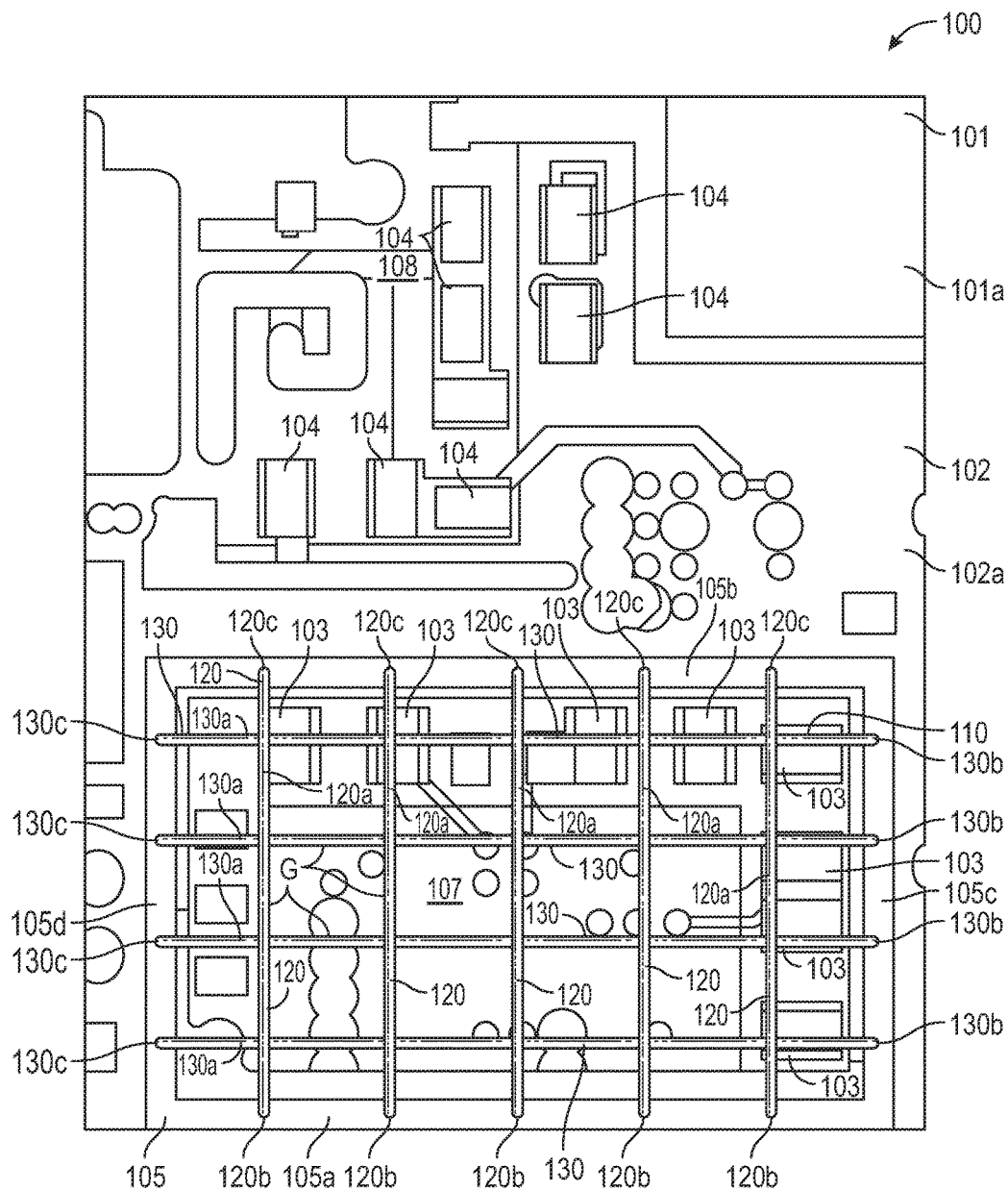

FIGS. 1A and 1B illustrate top perspective and top plan views, respectively, of a portion of an SiP module package 100 having a compartment EMI shield 110 in accordance with an exemplary embodiment. In FIGS. 1A and 1B, the EMC of the SiP module package has been omitted so that components inside of the SiP module package 100 are visible. The SiP module package 100 has a system PCB 101, a substrate 102 disposed on a top surface 101a of the system PCB 101, a first set of electrical components 103 mounted on a top surface 102a of the substrate 102, a second set of electrical components 104 mounted on the top surface 102a of the substrate 102, a common electrical ground structure 105 disposed on the top surface 102a of the substrate 102, and the compartment EMI shield 110 secured to the common electrical ground structure 105. The first set of electrical components 103 comprises first circuitry 107. The second set of electrical components 104 comprises second circuitry 108. The compartment EMI shield 110 surrounds and extends over the first circuitry 107.

The term "circuitry" or "functional block," as those terms are used herein, denote at least one electrical component that may be, for example, an active or passive electrical component or an integrated circuit (IC) chip or die. Some of the exemplary embodiments described herein show the compartment EMI shield being used to shield circuitry having multiple electrical components, but the circuitry that the compartment EMI shield is used to shield may be a single electrical component, such as an IC die, for example. The terms "SiP module package" or "system module package," as those terms are used herein, denote a package that has at least one circuit or functional block, which is shielded by a compartment EMI shield according to the present teachings.

In accordance with this exemplary embodiment, the compartment EMI shield 110 comprises first and second sets of electrically-conductive wires 120 and 130 (hereafter 'wires 120' and 'wires 130'), respectively. First and second ends of the first set of electrically-conductive wires 120 are connected to first and second portions 105a and 105b, respectively, of the common electrical ground structure 105. As depicted in FIGS. 1A and 1B, in an illustrative example, the first portion 105a and the second portion 105b of the common electrical ground structure 105 provide a unitary elongated conductive strip. First and second ends of the second set of electrically-conductive wires 130 are connected to third and fourth portions 105c and 105d, respectively, of the common electrical ground structure 105. A first length 120a of each of the wires 120 of the first set extends over the first circuitry 107 and is spaced apart from the electrical components 103 of the first circuitry 107 so as not to be in contact with the electrical components 103. The first lengths 120a of the wires 120 are substantially parallel to one another. A first length 130a of each of the wires 130 of the second set extends over the first circuitry 107 and is spaced apart from the electrical components 103 of the first circuitry 107 so as not to be in contact with the electrical components 103. The first lengths 130a of the wires 130 are substantially parallel to one another.

In accordance with this exemplary embodiment, the first lengths 130a of the wires 130 are substantially perpendicular to the first lengths 120a of the wires 120. In other words, in accordance with this embodiment, the aforementioned non-zero-degree angle is 90°. Second and third lengths 120b and 120c, respectively, of the wires 120 of the first set extend between opposite ends of their respective first lengths 120a and the common electrical ground structure 105. Ends of the second and third lengths 120b and 120c, respectively, are connected to the first and second portions 105a and 105b, respectively, of the common electrical ground structure 105. Likewise, second and third lengths 130b and 130c of the wires 130 of the second set extend between opposite ends of their respective first lengths 130a of the second wires 130 and the common electrical ground structure 105. Ends of the second and third lengths 130b and 130c, respectively, are connected to the third and fourth portions 105c and 105d, respectively, of the common electrical ground structure.

In the exemplary embodiment shown in FIGS. 1A and 1B, the first, second and third lengths 120a, 120b and 120c, respectively, of the wires 120 of the first set are straight, but a bend exists in each of the wires 120 where it transitions between the first length 120a and the respective second and third lengths 120b and 120c, respectively. Likewise, the first, second and third lengths 130a, 130b and 130c, respectively, of the wires 130 of the second set are straight, but a bend exists in each of the wires 130 where it transitions between the first lengths 130a and the respective second and third lengths 130b and 130c, respectively. This is merely one of many possible configurations and is not a requirement. In accordance with this illustrative embodiment, the angle of the bends is about 90°. However, there could be a smoother transition between the first lengths 120a and the respective second and third lengths 120b and 120c of the wires 120 of the first set. Likewise, there could be a smoother transition between the first lengths 130a and the respective second and third lengths 130b and 130c of the wires 130 of the second set.

As indicated above, a spacing exists between the top surfaces of the electrical components 103 and the first lengths 120a and 130a of the wires 120 and 130, respectively. A spacing also exists between the side surfaces of the electrical components 103 that are adjacent the periphery of the first circuitry 107 and the second lengths 120b and 130b and third lengths 120c and 130c of the wires 120 and 130, respectively, of the first and second sets, respectively. In most cases, it is desirable for the SiP module packages to have low profiles and to be compact due to spatial constraints in the environments in which they are often used (e.g., handheld wireless devices). Therefore, the spacing between the surfaces of the electrical components 103 and the wires 120 and 130 is typically only large enough to ensure that there is no contact between the electrical components 103 and the wires 120 and 130, even after the EMC (not shown) is over-molded onto the SiP module package.

In the exemplary embodiment shown in FIGS. 1A and 1B and in the exemplary embodiments described below, the wires 120 and 130 that are used to form the compartment EMI shield are typically bond wires of the type that are used in wire bonding processes to electrically interconnect electrical contacts of a component to electrical contacts of another component or electrical contacts of a PCB. In accordance with an exemplary embodiment, the compartment EMI shields are formed during the wire bonding process that is used to make such interconnections. In other exemplary embodiments, the compartment EMI shields are pre-formed and then attached to the common electrical ground structure. Exemplary embodiments of methods for making the compartment EMI shield are described below in more detail with reference to FIGS. 10 and 11.

With reference again to FIG. 1B, the first lengths 120a of wires 120 are at a non-zero-degree angle to the first lengths 130a of wires 130 of the second set. Where adjacent first lengths 120a of the wires 120 of the first set intersect adjacent first lengths 130a of the wires 130 of the second set, intersections exist. Each intersection is bounded on first and second sides by the adjacent first lengths 120a of the wires 120 of the first set and is bounded on third and fourth sides by the adjacent first lengths 130a of the wires 130 of the second set, where the first and second sides of the intersection are substantially parallel to one another and are at a non-zero-degree angle to the third and fourth sides of the intersection. In this exemplary embodiment, the non-zero-degree angle is 90°. The area inside of each intersection bounded by the first lengths 120a and 130a of the wires 120 and 130, respectively, of the first and second sets, respectively, constitutes a gap, G, of a predetermined size selected to ensure that the EMI shield attenuates a frequency or frequency range of interest. In other words, the compartment EMI shield 110 functions as a Faraday cage and the size of the gap, G, is preselected based on the wavelength or wavelength range to be attenuated.

For example, the spacing, or pitch, between adjacent wires 120 of the first set may be 500 micrometers (microns) and the pitch between adjacent wires 130 of the second set may be 400 microns. Therefore, the size of the gaps, G, in this example are 400×500 microns. Using typical bond wires for the wires 120 and 130 and pitches of 500 microns and 400 microns, respectively, this configuration of the compartment EMI shield 110 results in about a 5.4 decibel (dB) improvement in EMI shielding for frequencies ranging from about 1.9 Gigahertz (GHz) to about 2.5 GHz compared to emissions from the first circuitry 107 if no compartment EMI shield is used.

Figure 2:
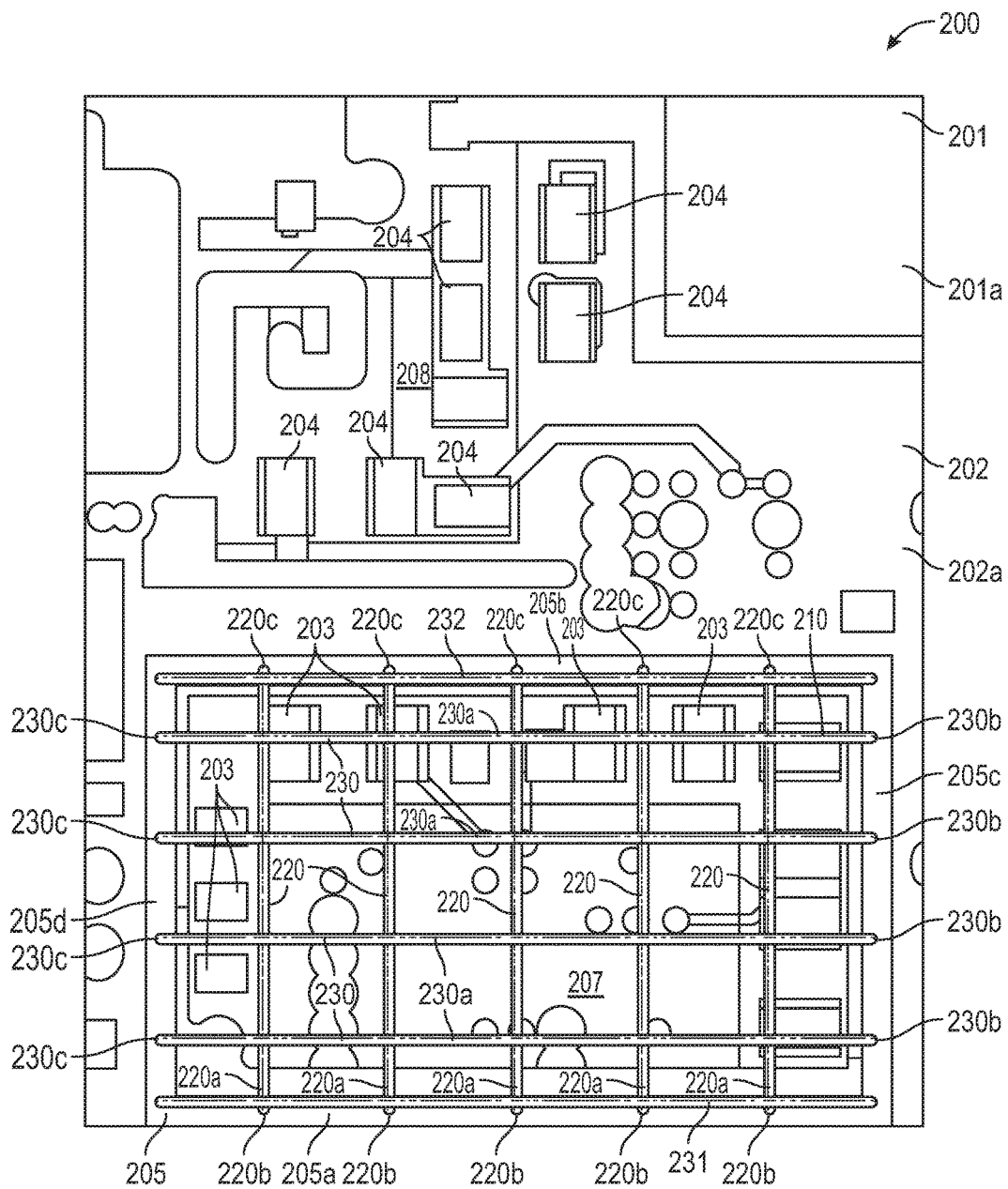
FIG. 2 illustrates a top plan view of a portion of an SiP module package having a compartment EMI shield in accordance with an exemplary embodiment.

FIG. 2 illustrates a top plan view of a portion of an SiP module package 200 having a compartment EMI shield 210 in accordance with an exemplary embodiment. In FIG. 2, the EMC of the SiP module package has been omitted so that components inside of the SiP module package 200 are visible. The SiP module package 200 has a system PCB 201, a substrate 202 disposed on a top surface 201a of the system PCB 201, a first set of electrical components 203 mounted on a top surface 202a of the substrate 202, a second set of electrical components 204 mounted on the top surface 202a of the substrate 202, a common electrical ground structure 205 disposed on the top surface 202a of the substrate 202, and the compartment EMI shield 210 secured to the common electrical ground structure 205. The first set of electrical components 203 comprises a first circuitry 207. The second set of electrical components 204 comprises a second circuitry 208. The compartment EMI shield 210 surrounds and extends over the first circuitry 207.

As with the exemplary embodiment shown in FIGS. 1A and 1B, in accordance with this exemplary embodiment, the compartment EMI shield 210 comprises first and second sets of electrically-conductive wires 220 and 230 (hereafter 'wires 220' and 'wires 230'), respectively. First and second ends of the first set of electrically-conductive wires 220 are connected to first and second portions 205a and 205b, respectively, of the common electrical ground structure 205. First and second ends of the second set of electrically-conductive wires 230 are connected to third and fourth portions 205c and 205d, respectively, of the common electrical ground structure 205. A first length 220a of each of the wires 220 of the first set extends over the first circuitry 207 and is spaced apart from the electrical components 203 of the first circuitry 207 so as not to be in contact with the electrical components 203. The first lengths 220a of the wires 220 are substantially parallel to one another. Second and third lengths 220b and 220c, respectively, of the wires 220 of the first set extend between opposite ends of their respective first lengths 220a and the common electrical ground structure 205. Ends of the second and third lengths 220b and 220c, respectively, are connected to the first and second portions 205a and 205b, respectively, of the common electrical ground structure 205.

A first length 230a of each of the wires 230 of the second set extends over the first circuitry 207 and is spaced apart from the electrical components 203 of the first circuitry 207 so as not to be in contact with the electrical components 203. The first lengths 230a of the wires 230 of the second set are substantially parallel to one another. Second and third lengths 230b and 230c, respectively, of each of the wires 230 of the second set extend between opposite ends of their respective first lengths 230a of the second wires 230 and the common electrical ground structure 205. Ends of the second and third lengths 230b and 230c, respectively, are connected to the third and fourth portions 205c and 205d, respectively, of the common electrical ground structure 205.

The compartment EMI shield 210 shown in FIG. 2 is identical to the compartment EMI shield 110 shown in FIGS. 1A and 1B except that the compartment EMI shield 210 shown in FIG. 2 further includes first and second wires 231 and 232, respectively, that extend along opposite sides of the compartment EMI shield 210 adjacent the first and second portions 205a and 205b, respectively, of the common electrical ground structure 205. These additional wires 231 and 232 improve the EMI shielding effectiveness and the mechanical stability of the compartment EMI shield 210 over those of the compartment EMI shield 110 shown in FIGS. 1A and 1B. Using typical bond wires for the wires 220, 230, 231 and 232 and pitches of 500 microns and 400 microns for the wires 220 and 230, respectively, this configuration of the compartment EMI shield 210 results in about a 5 dB improvement in EMI shielding over that achieved using the compartment EMI shield 110 shown in FIGS. 1A and 1B.

Figure 3A:
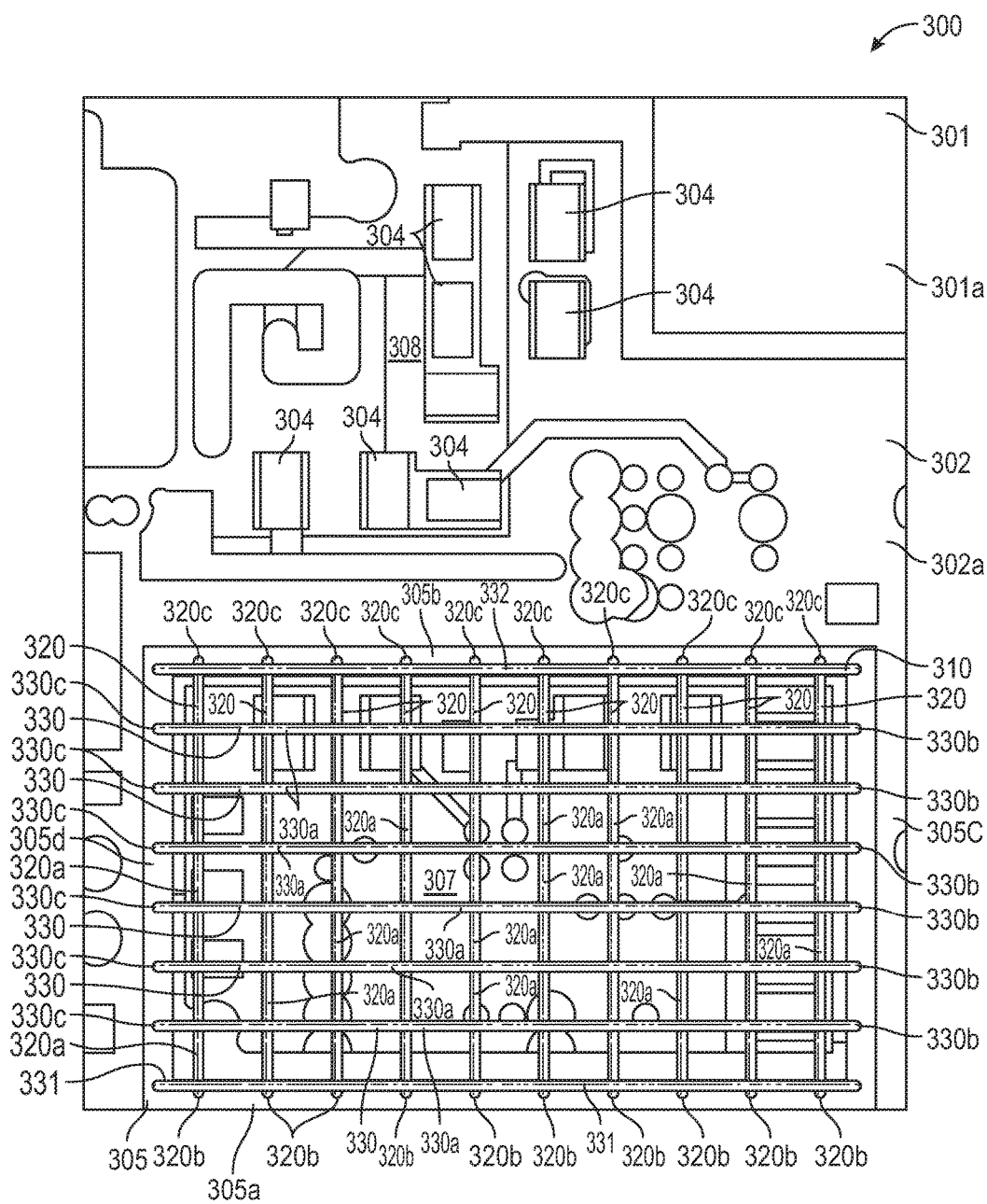
FIGS. 3A and 3B illustrate top plan and top perspective views, respectively, of a portion of an SiP module package having a compartment EMI shield in accordance with an exemplary embodiment.
Figure 3B:
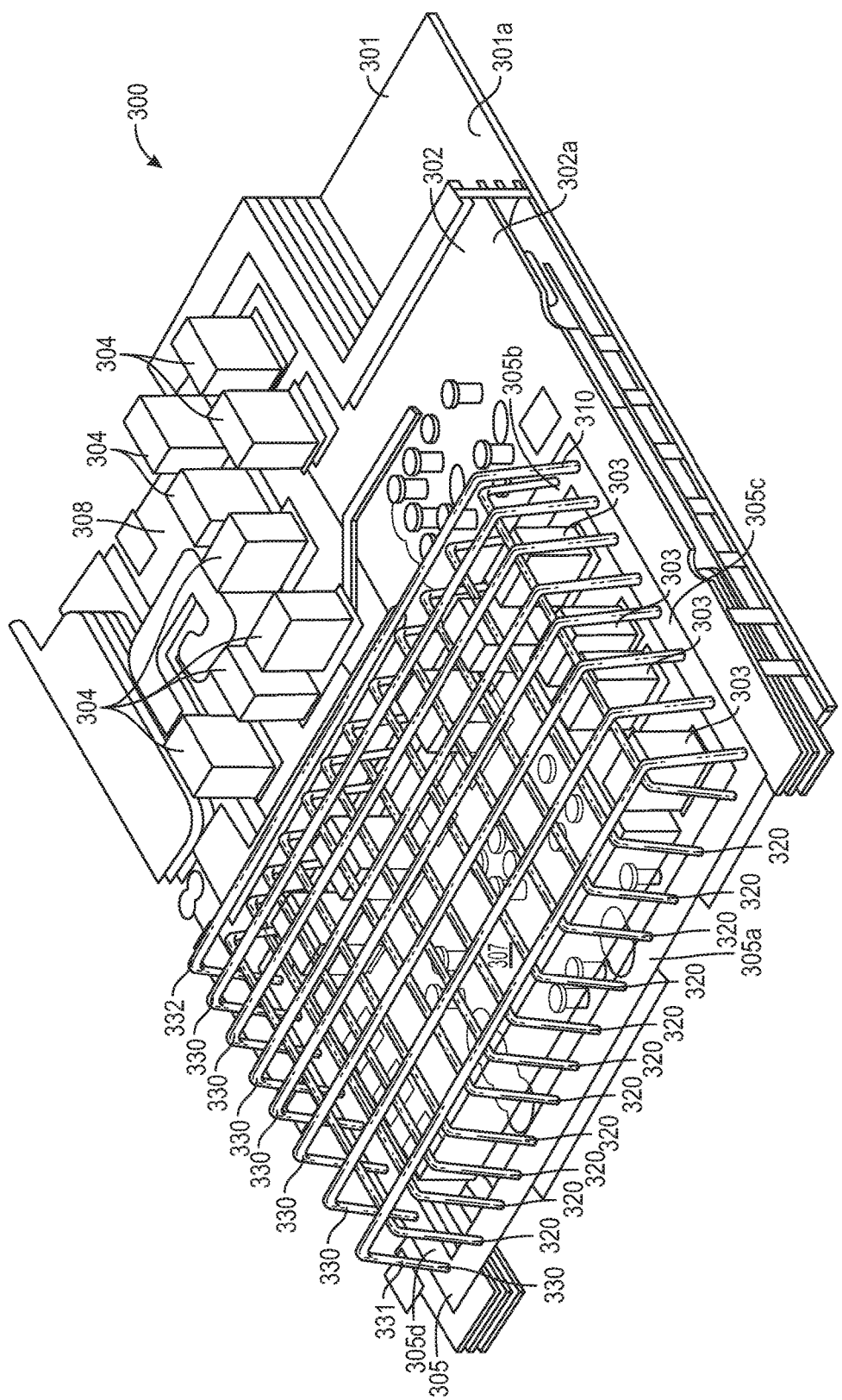

FIGS. 3A and 3B illustrate top plan and top perspective views, respectively, of a portion of an SiP module package 300 having a compartment EMI shield 310 in accordance with an exemplary embodiment. In FIGS. 3A and 3B, the EMC of the SiP module package 300 has been omitted so that components inside of the SiP module package 300 are visible. The SiP module package 300 has a system PCB 301, a substrate 302 disposed on a top surface 301a of the system PCB 301, a first set of electrical components 303 mounted on a top surface 302a of the substrate 302, a second set of electrical components 304 mounted on the top surface 302a of the substrate 302, a common electrical ground structure 305 disposed on the top surface 302a of the substrate 302, and the compartment EMI shield 310 secured to the common electrical ground structure 305. The first set of electrical components 303 comprises a first circuitry 307. The second set of electrical components 304 comprises a second circuitry 308. The compartment EMI shield 310 surrounds and extends over the first circuitry 307.

As with the exemplary embodiment shown in FIGS. 1A-2, in accordance with this exemplary embodiment, the compartment EMI shield 310 comprises first and second sets of electrically-conductive wires 320 and 330 (hereafter 'wires 320' and 'wires 330'), respectively. The compartment EMI shield also includes additional electrically-conductive wires 331 and 332. First and second ends of the first set of electrically-conductive wires 320 are connected to first and second portions 305a (FIG. 3A) and 305b (FIG. 3B), respectively, of the common electrical ground structure 305. First and second ends of the second set of electrically-conductive wires 330 are connected to third and fourth portions 305c and 305d, respectively, of the common electrical ground structure 305. Each wire 320 of the first set includes first, second and third lengths 320a, 320b and 320c, respectively (FIG. 3A). Each wire 330 of the second set includes first, second and third lengths 330a, 330b and 330c, respectively (FIG. 3A). First and second ends of the additional electrically-conductive wires 331 and 332 are connected to the third and fourth portions 305c (FIG. 3A) and 305d (FIG. 3B), respectively, of the common electrical ground structure 305.

The compartment EMI shield 310 shown in FIGS. 3A and 3B is identical to the compartment EMI shield 210 shown in FIG. 2 except that the pitch between adjacent wires 320 of the first set and the pitch between adjacent wires 330 of the second set is smaller than the pitch between adjacent wires 220 of the first set and between adjacent wires 230 of the second set. For example, in accordance with this exemplary embodiment, the pitch between adjacent wires 320 of the first set is 250 microns and the pitch between adjacent wires 330 of the second set is 250 microns. Using typical bond wires for the wires 320 and 330 and pitches of 250 microns and 250 microns, respectively, this configuration of the compartment EMI shield 310 results in about a 5 dB improvement in EMI shielding over that achieved using the compartment EMI shield 110 shown in FIGS. 1A and 1B and about a 2.5 dB improvement in EMI shielding over that achieved using the compartment EMI shield 210 shown in FIG. 2.

Figure 4A:
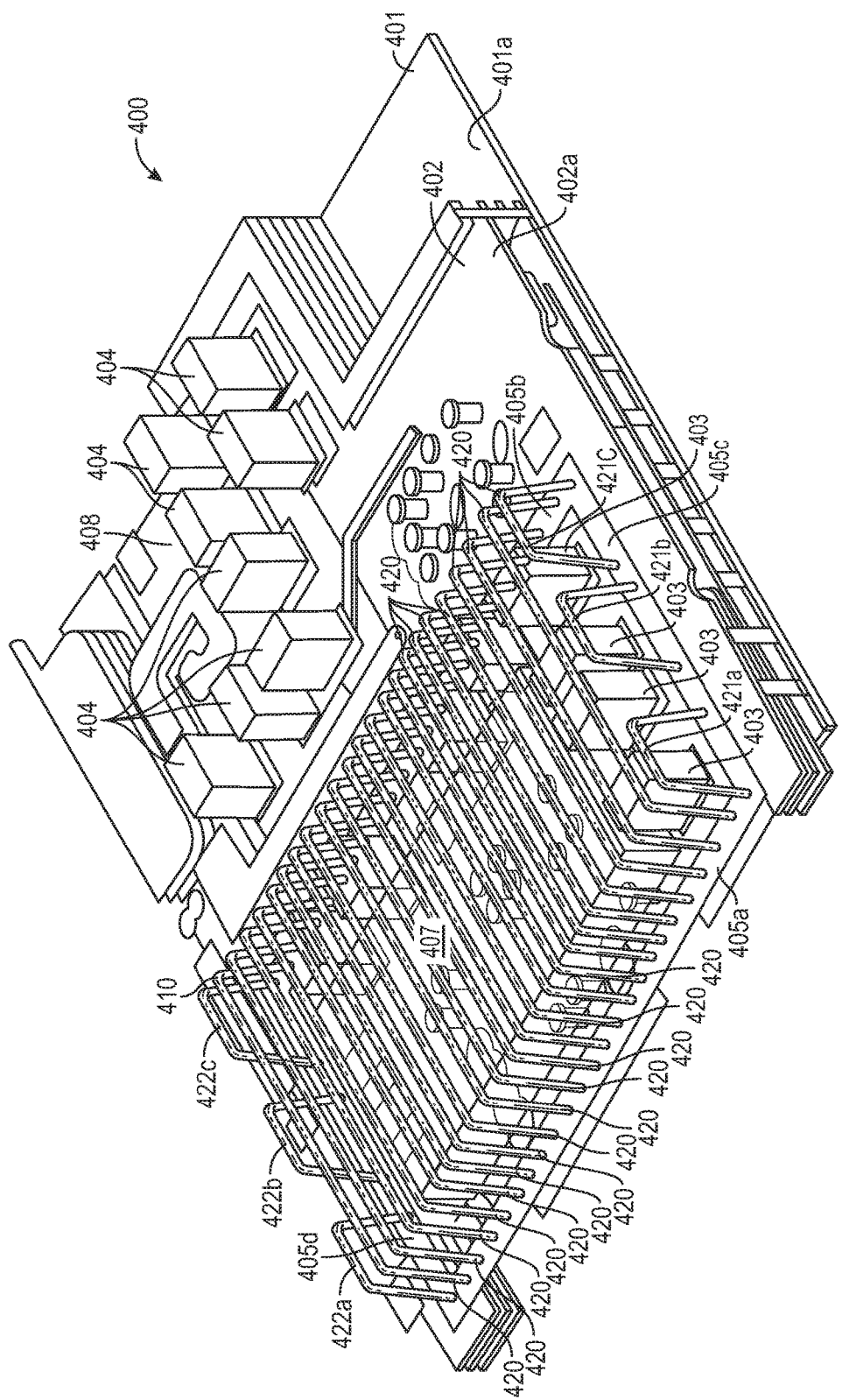
FIGS. 4A and 4B illustrate top perspective and top plan views, respectively, of a portion of an SiP module package having a compartment EMI shield in accordance with an exemplary embodiment.
Figure 4B:
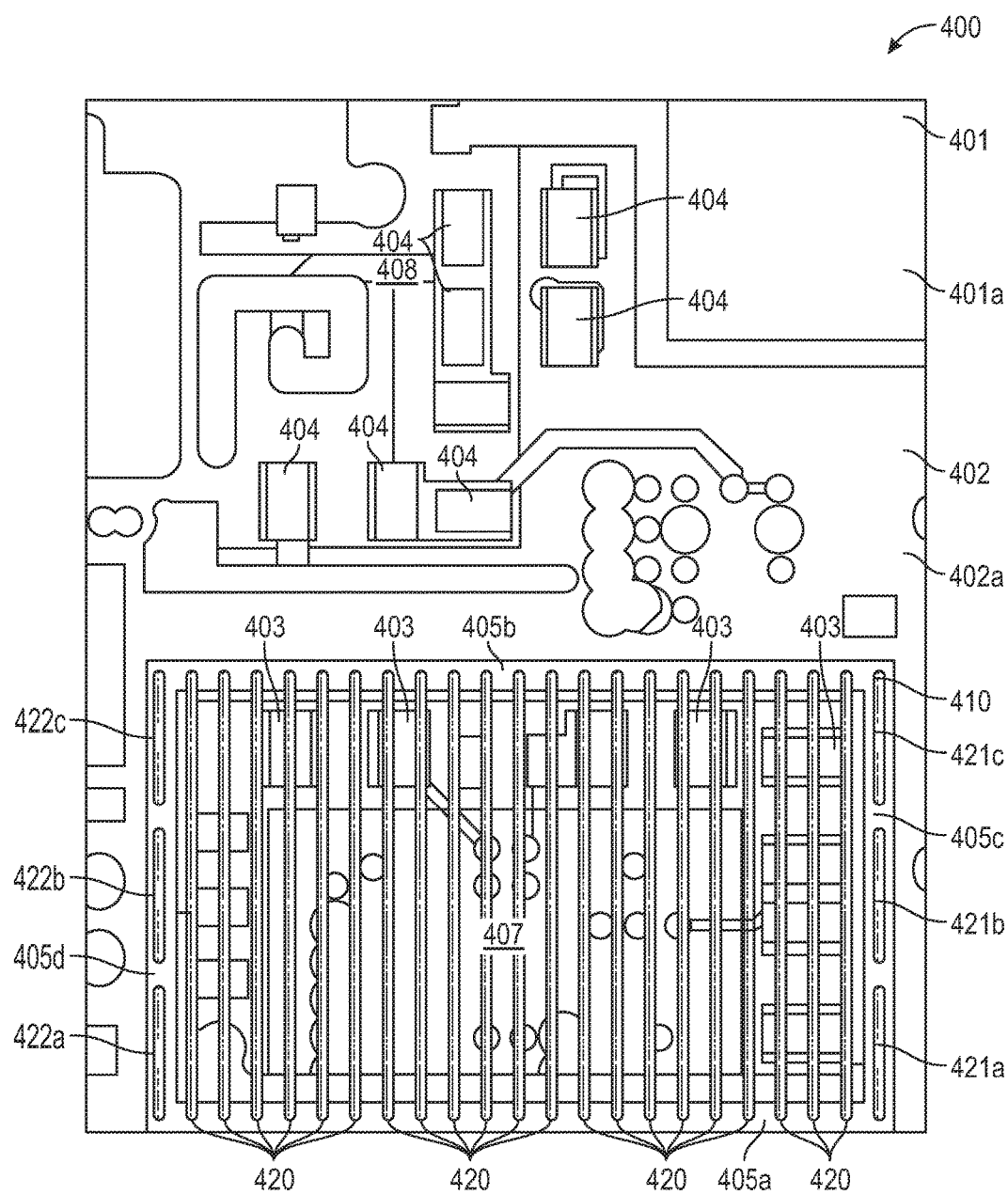

FIGS. 4A and 4B illustrate top perspective and top plan views, respectively, of a portion of an SiP module package 400 having a compartment EMI shield 410 in accordance with an exemplary embodiment. In FIG. 4A and $B, the EMC of the SiP module package 400 has been omitted so that components inside of the SiP module package 400 are visible. The SiP module package 400 has a system PCB 401, a substrate 402 disposed on a top surface 401a of the system PCB 401, a first set of electrical components 403 mounted on a top surface 402a of the substrate 402, a second set of electrical components 404 mounted on the top surface 402a of the substrate 402, a common electrical ground structure 405 disposed on the top surface 402a of the substrate 402, and the compartment EMI shield 410 secured to the common electrical ground structure 405. The first set of electrical components 403 comprises a first circuitry 407. The second set of electrical components 404 comprises a second circuitry 408. The compartment EMI shield 410 surrounds and extends over the first circuitry 407.

In accordance with this exemplary embodiment, the compartment EMI shield 410 comprises a first set of electrically-conductive wires 420 (hereafter 'wires 420') and electrically-conductive wire portions 421a-421c and 422a-422c (hereafter 'wire portions 422a-422c'). The wires 420 are substantially parallel to one another and have first and second ends that are connected to first and second portions 405a and 405b, respectively, of the common electrical ground structure 405. First and second ends of the wire portions 421a-421c are connected to a third portion 405c of the common electrical ground structure 405. First and second ends of the wire portions 422a-422c are connected to a fourth portion 405d of the common electrical ground structure 405.

The compartment EMI shield 410 is effective at reducing emissions of a particular frequency or range of frequencies from the first circuitry 407. The particular frequency or range of frequencies that are attenuated and the extent of attenuation depends, at least in part, on the spacing or pitch between adjacent wires 420. For example, if typical bond wires having a pitch of about 125 microns are used, an EMI shielding improvement of about 7 dB is achieved for frequencies ranging from about 1.9 GHz or about 2.5 GHz compared to EMI emissions if no compartment EMI shield is used. If typical bond wires having a pitch of about 250 microns are used, the EMI shielding improvement for frequencies ranging from about 1.9 GHz to about 2.5 GHz is about 5 dB. If typical bond wires having a pitch of about 500 microns are used, the EMI shielding improvement for frequencies ranging from about 1.9 GHz to about 2.5 GHz is about 2 to 3 dB.

Figure 5:
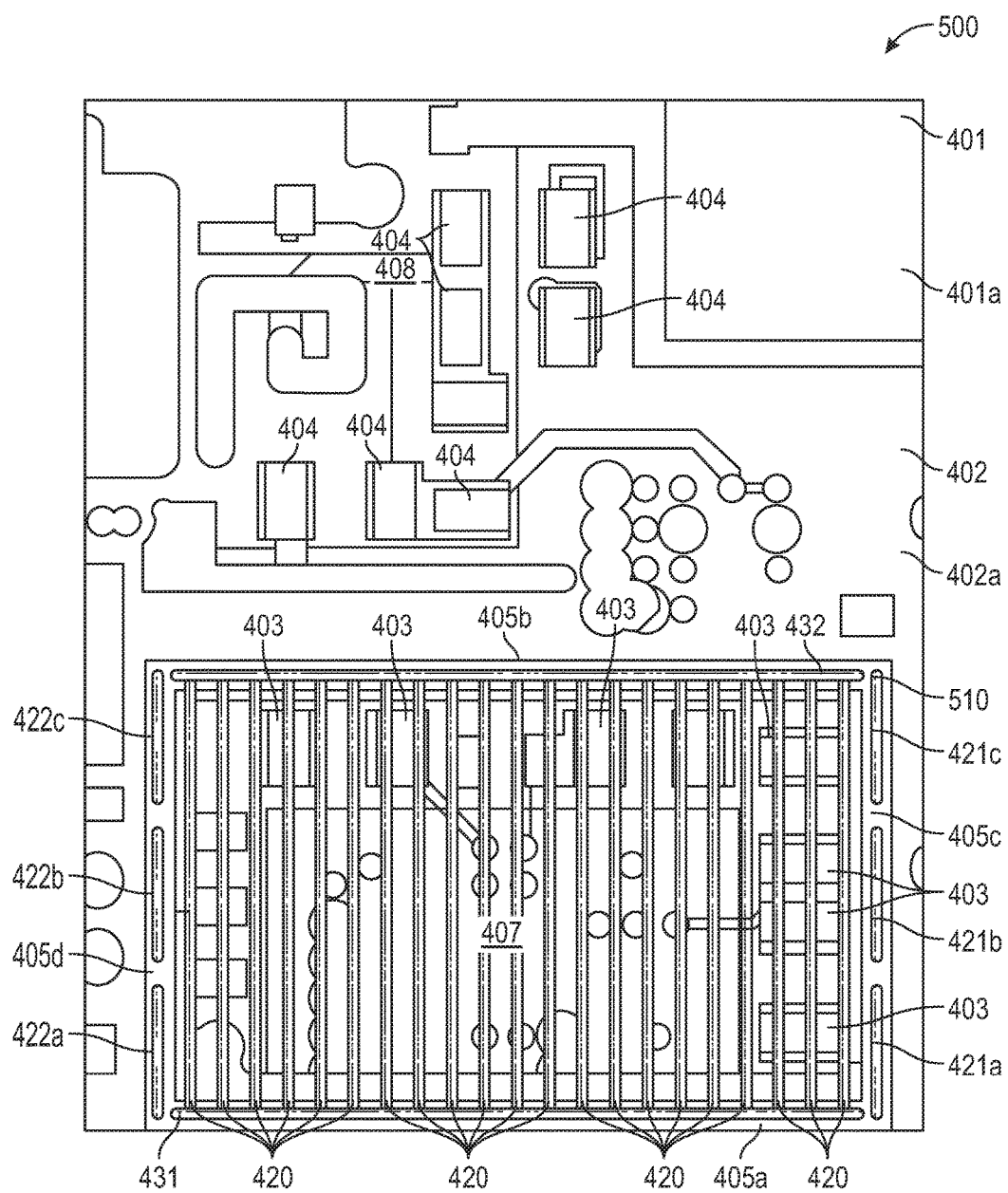
FIG. 5 illustrates a top plan view of a portion of an SiP module package that is identical to the portion of the SiP module package shown in FIGS. 4A and 4B except that the compartment EMI shield of the portion of the SiP module package shown in FIG. 5 further includes first and second wires that extend along opposite sides of the compartment EMI cage.

FIG. 5 illustrates a top plan view of a portion of an SiP module package 500 that is identical to the portion of the SiP module package 400 shown in FIGS. 4A and 4B except that the compartment EMI shield 510 of the portion of the SiP module package 500 shown in FIG. 5 further includes first and second wires 431 and 432, respectively, that extend along opposite sides of the compartment EMI shield 510 adjacent the first and second portions 405a and 405b, respectively, of the common electrical ground structure 405. These additional wires 431 and 432 further improve the effectiveness of the compartment EMI shield 510 and the mechanical stability of the compartment EMI shield 510 over those of the compartment EMI shield 410 shown in FIGS. 4A and 4B. For example, with respect to EMI shielding effectiveness, assuming typical bond wires having a pitch of about 125 microns are used for the wires 420, the compartment EMI shield 510 provides an improvement in EMI shielding of about 4 dB for frequencies ranging from about 1.9 GHz or about 2.5 GHz compared to that achieved by the compartment EMI shield 410 having the configuration shown in FIGS. 4A and 4B.

Figure 6:
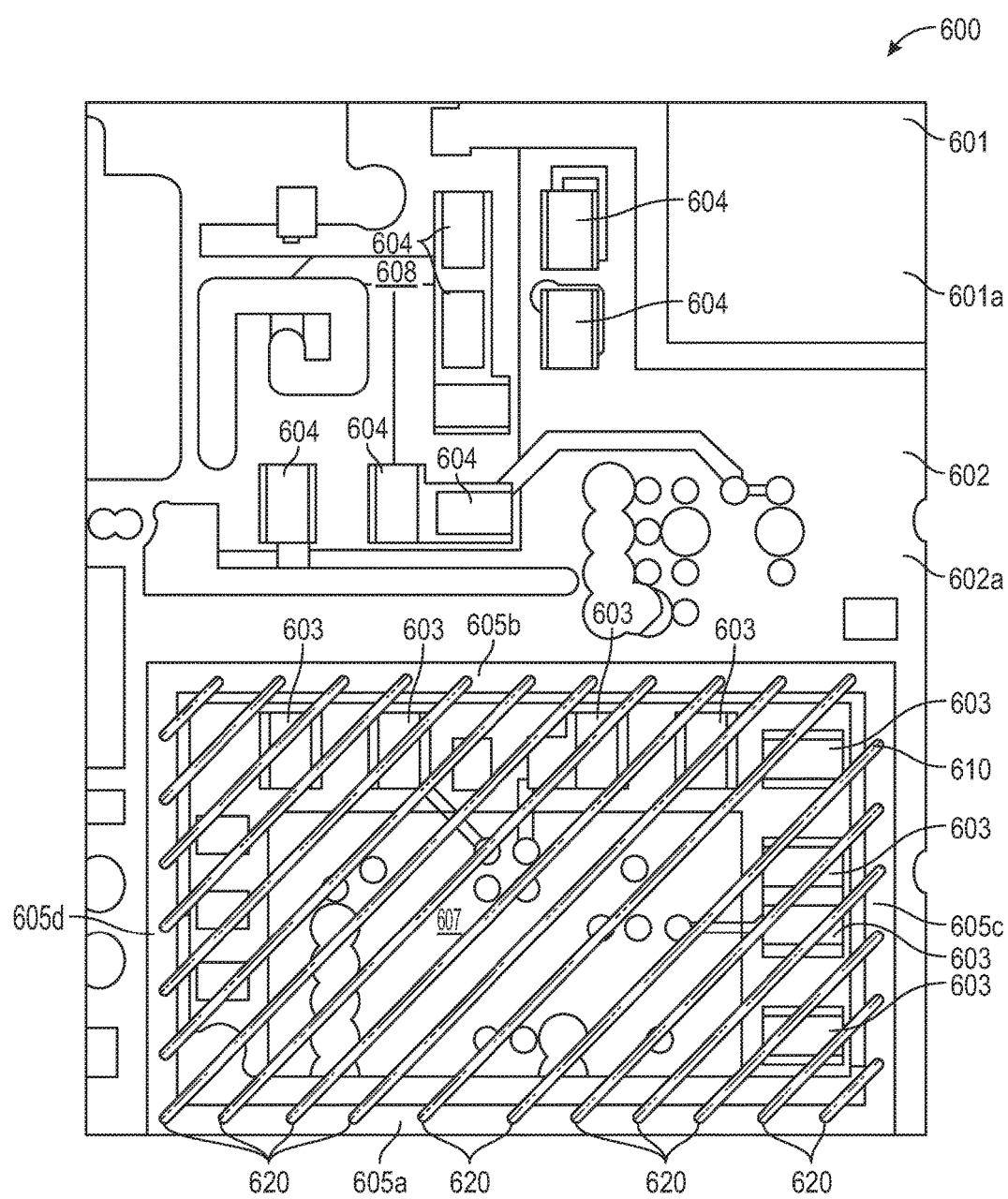
FIG. 6 illustrates a top plan view of a portion of an SiP module package having a compartment EMI shield in accordance with another exemplary embodiment.

FIG. 6 illustrates a top plan view of a portion of an SiP module package 600 having a compartment EMI shield 610 in accordance with another exemplary embodiment. The EMC of the SiP module package 600 has been omitted so that components inside of the SiP module package 600 are visible. The SiP module package 600 has a system PCB 601, a substrate 602 disposed on a top surface 601a of the system PCB 601, a first set of electrical components 603 mounted on a top surface 602a of the substrate 602, a second set of electrical components 604 mounted on the top surface 602a of the substrate 602, a common electrical ground structure 605 disposed on the top surface 602a of the substrate 602, and the compartment EMI shield 610 secured to the common electrical ground structure 605. The first set of electrical components 603 comprises a first circuitry 607. The second set of electrical components 604 comprises a second circuitry 608. The compartment EMI shield 610 surrounds and extends over the first circuitry 607.

In accordance with this exemplary embodiment, the compartment EMI shield 610 comprises a first set of electrically-conductive wires 620 (hereafter 'wires 620'). The wires 620 are substantially parallel to one another, have first ends that are connected to either a first or a fourth portion 605a and 605d, respectively, of the common electrical ground structure 605, and have second ends that are connected to either a second or a third portion 605b and 605c, respectively, of the common electrical ground structure 605. Each of the wires 620 is at an acute angle, α, relative to the portion of the common electrical ground structure 605 to which first and second ends of the wire 620 are connected. Stated another way, all of the wires 620 are at an acute angle α relative to side walls of the electrical components 603 over and above which the wires 620 extend. In accordance with the exemplary embodiment shown in FIG. 6, the acute angle α is 45°, although other acute angles could be used. The acute angle α typically ranges from about 30° to about 60°.

The compartment EMI shield 610 is effective at reducing emissions of a particular frequency or range of frequencies from the first circuitry 607. The particular frequency or range of frequencies that are attenuated and the extent of attenuation depends, at least in part, on the pitch between adjacent wires 620. For example, if typical bond wires having a pitch of about 250 microns are used for the compartment EMI shield 610, it provides about the same EMI shielding effect as that provided by the compartment EMI shield 510 shown in FIG. 5 having the same pitch, and provides about a 5 dB improvement compared to the case where no compartment EMI shield is used.

Figure 7:
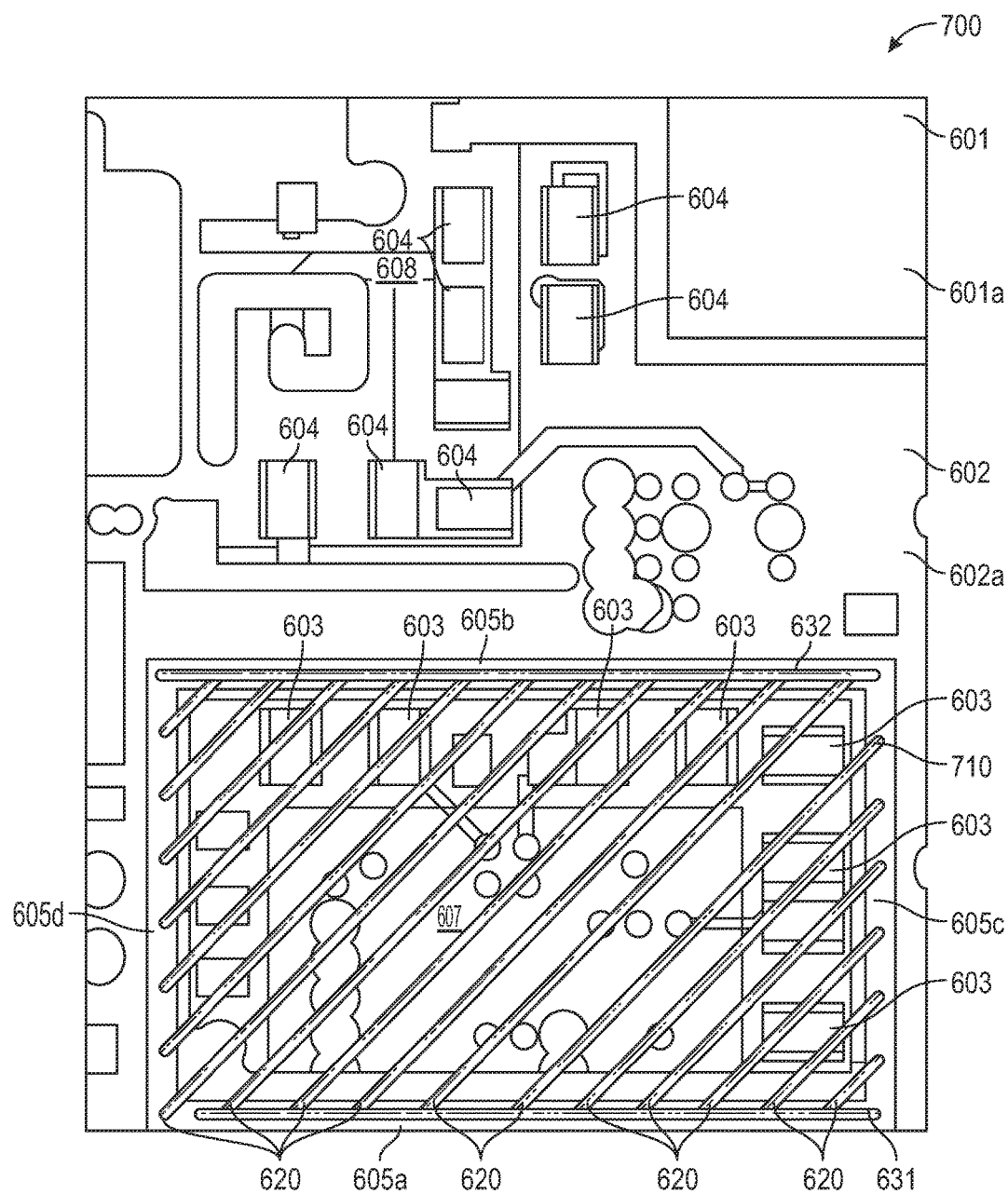
FIG. 7 illustrates a top plan view of a portion of an SiP module package that is identical to the portion of the SiP module package shown in FIG. 6 except that the compartment EMI shield of the SiP module package shown in FIG. 7 further includes first and second electrically-conductive wires that extend along opposite sides of the compartment EMI cage.

FIG. 7 illustrates a top plan view of a portion of an SiP module package 700 that is identical to the portion of the SiP module package 600 shown in FIG. 6 except that the compartment EMI shield 710 of the SiP module package 700 shown in FIG. 7 further includes first and second electrically-conductive wires 631 and 632 (hereafter 'wires 631' and 'wires 632'), respectively, that extend along opposite sides of the compartment EMI cage 710 adjacent the first and second portions 605a and 605b, respectively, of the common electrical ground structure 605. The first and second electrically-conductive wires 631 and 632, respectively, are substantially parallel to one another and are substantially parallel to the first and second portions 605a and 605b, respectively, of the common electrical ground structure 605. These additional wires 631 and 632 further improve the EMI shielding effectiveness and the mechanical stability of the compartment EMI shield 710 over that provided by the compartment EMI shield 610 shown in FIG. 6. With respect to EMI shielding effectiveness, assuming that typical bond wires having a pitch of about 250 microns are used for the wires 620, the compartment EMI shield 710 provides an improvement in EMI shielding of about 4 dB for frequencies ranging from about 1.9 GHz or about 2.5 GHz compared to that achieved by the compartment EMI shield 610 shown in FIG. 6.

Figure 8A:
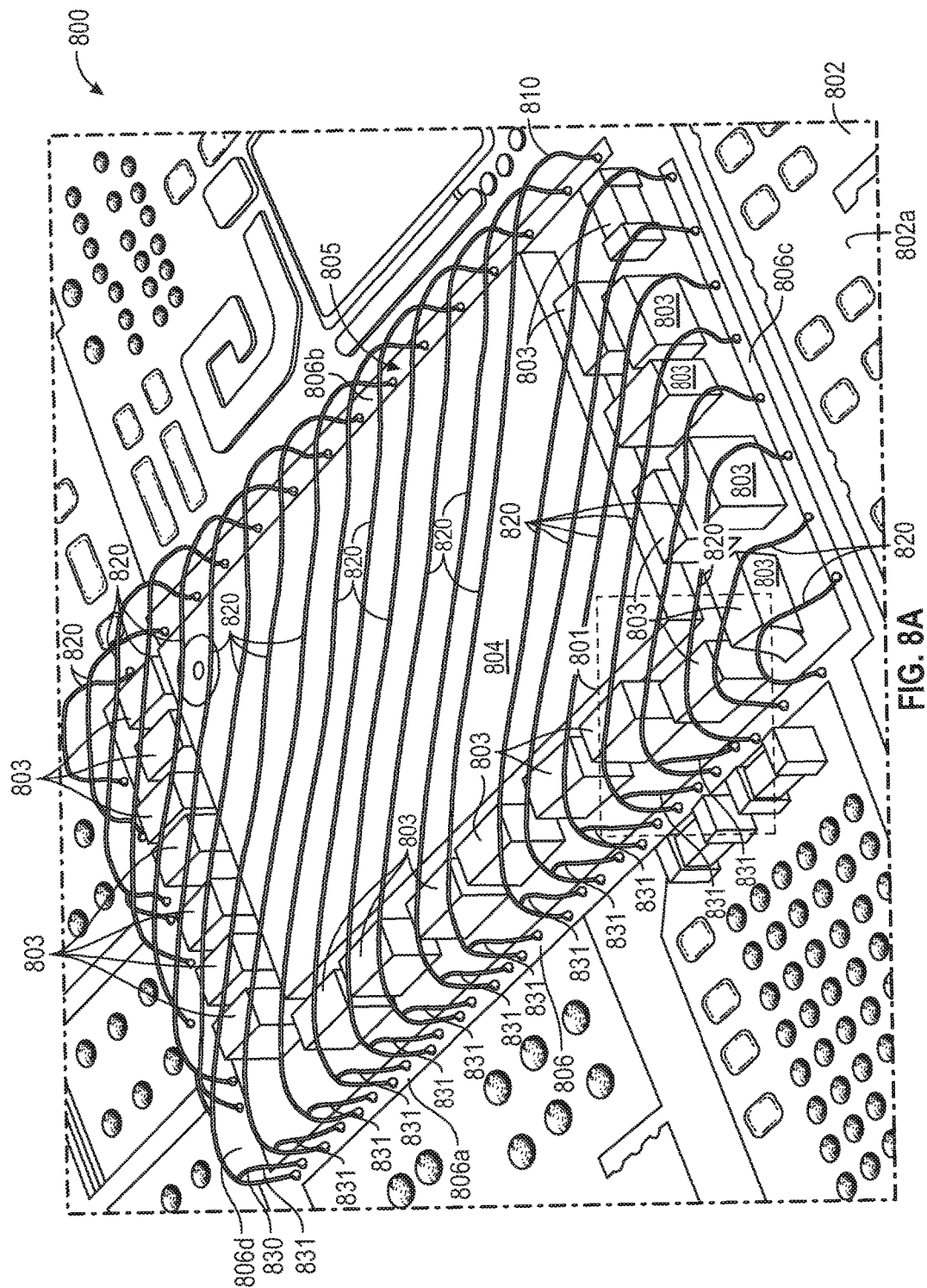
FIG. 8A illustrates a top perspective view of a portion of an SiP module package in accordance with an exemplary embodiment.
Figure 8B:
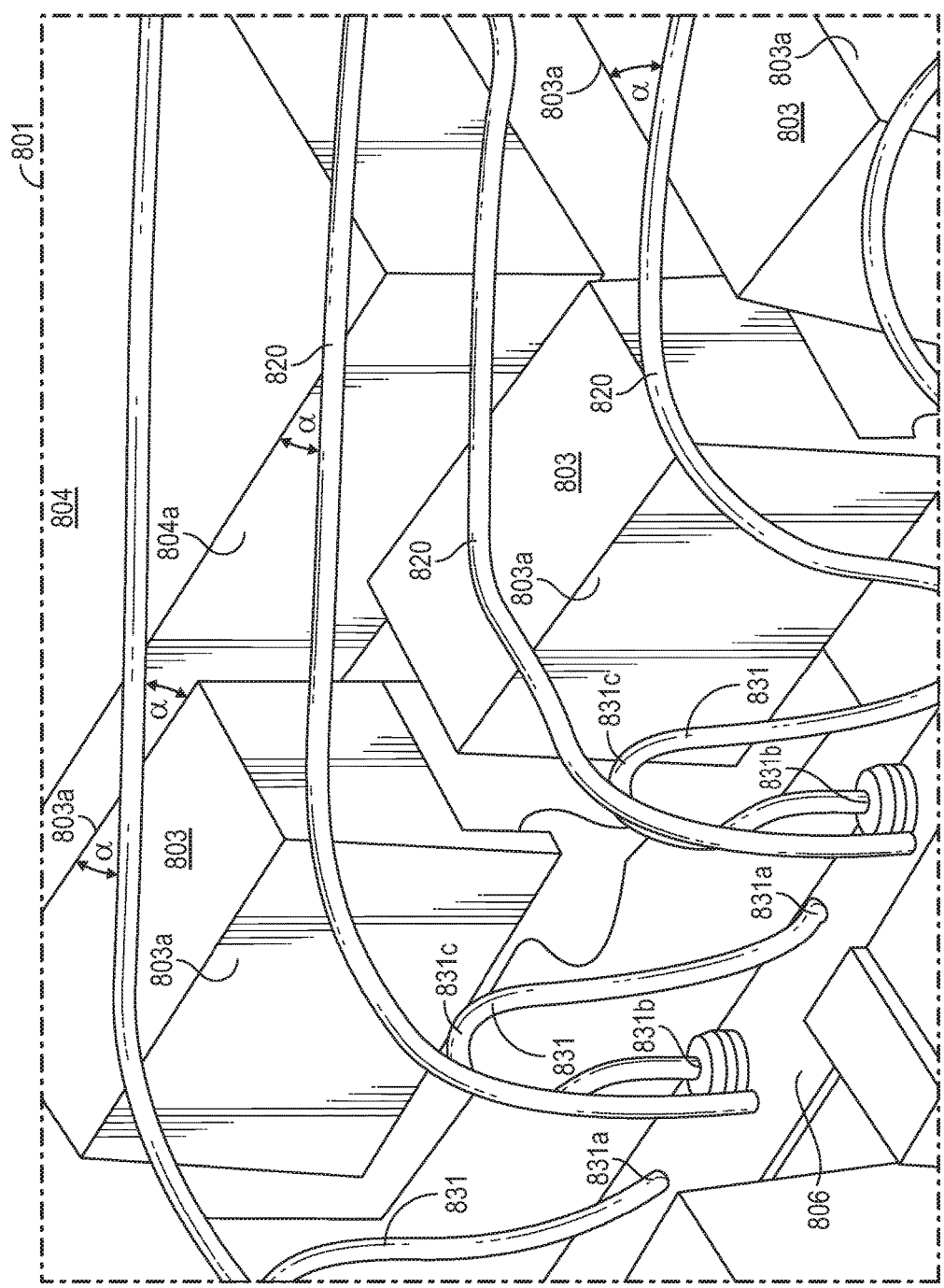
FIG. 8B illustrates an enlarged view of the area contained in dashed box shown in FIG. 8A.

FIG. 8A illustrates a top perspective view of a portion of an SiP module package 800 in accordance with an exemplary embodiment. FIG. 8B illustrates an enlarged view of the area contained in dashed box 801 shown in FIG. 8A. The EMC of the SiP module package 800 has been omitted so that components inside of the SiP module package 800 are visible. The SiP module package 800 has a PCB 802, electrical components 803 and 804 mounted on a top surface 802a of the PCB 802 and comprising a first circuitry 805, a common electrical ground structure 806 disposed on the top surface 802a of the PCB 802, and the compartment EMI shield 810 secured to the common electrical ground structure 806. The compartment EMI shield 810 surrounds and extends over the first circuitry 805.

The compartment EMI shield 810 is very similar to the compartment EMI shield 610 shown in FIG. 6 in that electrically-conductive wires 820 (hereafter 'wires 820') of the compartment EMI shield 810 are substantially parallel to one another and are at an acute angle α relative to the portions of the common electrical ground structure 806 to which ends of the wires 820 are connected. The wires 820 have first ends that are connected to either a first portion 806a or a fourth portion 806d, respectively, of the common electrical ground structure 806, and have second ends that are connected to either a second portion 806b or a third portion 806c, respectively, of the common electrical ground structure 806. Each of the wires 820 is at the acute angle α relative to the portions of the common electrical ground structure 806 to which the first and second ends of the wires 820 are connected. Stated another way, all of the wires 820 are at the acute angle α relative to side walls of the electrical components 803 or 804 over and above which the wires 820 extend. In accordance with the exemplary embodiment shown in FIGS. 8A and 8B, the acute angle α is 45°, although other acute angles could be used. For example, the acute angle α typically ranges from about 30° to about 60°.

In addition to the wires 820, the compartment EMI shield 810 includes a peripheral wire fence 830 that extends along the first portion 806a of the common electrical ground structure 806. The peripheral wire fence 830 comprises a plurality of short wire segments 831 (hereafter 'wire segments 831') having first and second ends that are connected to the common electrical ground structure 806. Each wire segment 831 has a first end that is connected to a location on the common electrical ground structure 806 and a second end that is connected to a nearby location on the common electrical ground structure 806. In accordance with this exemplary embodiment, the first and second ends of all of the wire segments 831 are connected to the first portion 806a of the common electrical ground structure 806, but in other embodiments, the first and second ends may be connected to other portions of the common electrical ground structure 806, as was demonstrated above with reference to FIG. 6.

With reference to FIG. 8B, each wire segment 831 extends upwardly away from where the first end 831a of the wire segment 831 is connected to the common electrical ground structure 806, then bends and extends downwardly toward where the second end 831b of the wire segment 831 is connected to the common electrical ground structure 806. The wires 820 come into contact with respective wire segments 831 of the peripheral wire fence 830. The peripheral wire fence 830 improves the EMI shielding effectiveness of the compartment EMI shield 810 and prevents the wires 820 from coming into contact with the electrical components 803, 804 of the first circuitry 805. In accordance with this exemplary embodiment, the electrical components 803 and 804 are rectangular in shape and have sides 803a and 804a, respectively, that are parallel to one another and that are at the acute angle α relative to the portions of the wires 820 that extend over and above them.

In accordance with an exemplary embodiment, top portions 831c (FIG. 8B) of the wire segments 831 are at a sufficient height from the common electrical ground structure 806 to ensure that the bonding angle, i.e., the angle at which the wire 820 approaches the portion of common electrical ground structure 806, is sufficiently large to ensure that the wires 820 do not come into contact with the electrical components 803, 804. In other words, because the wires 820 are forced to pass over the top portions 831c of the wire segments 831, the height of the top portions 831c dictates the height of the respective wires 820 at the locations at which the wires 820 pass over the respective top portions 831c. In this way, the height of the top portions 831c is selected to ensure that there is sufficient clearance between the wires 820 and the top surfaces of the electrical components 803, 804.

Figure 9:
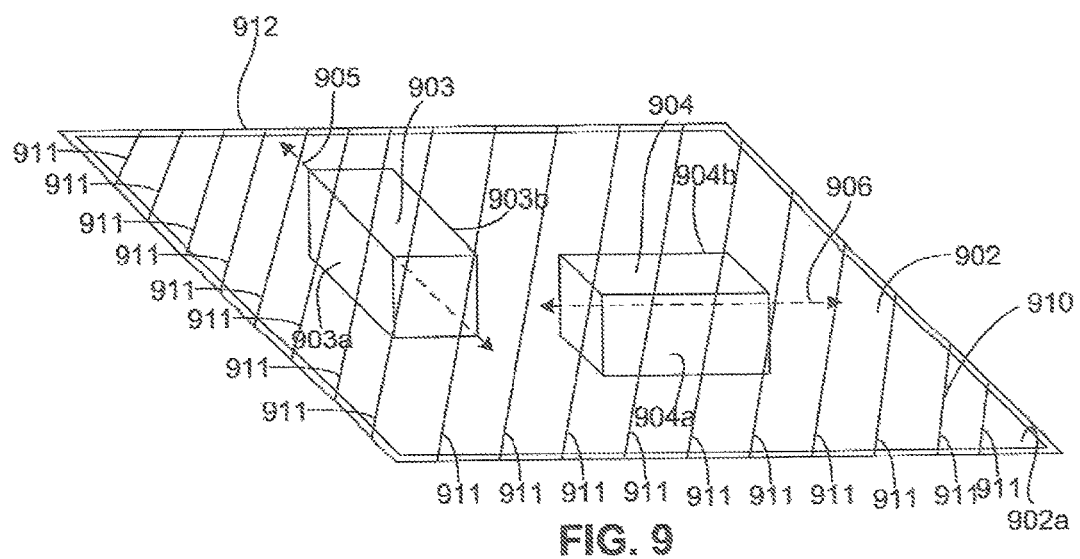
FIG. 9 illustrates a top perspective view of a portion of a substrate having two electrical components mounted on a top surface thereof and having a compartment EMI shield that may be identical to the compartment EMI shield shown in FIG. 6.

FIG. 9 illustrates a top perspective view of a portion of a substrate 902 having two electrical components 903 and 904 mounted on a top surface 902a thereof and having a compartment EMI shield 910 that may be identical to the compartment EMI shield 610 shown in FIG. 6. In accordance with this exemplary embodiment, the electrical components 903 and 904 are first and second inductors, respectively, having respective axes 905 and 906 that are perpendicular to one another and parallel to a plane in which the top surface 902a of the substrate 902 resides. The compartment EMI shield 910 comprises a plurality of electrically-conductive wires 911 that are substantially parallel to one another and that are at an acute angle, α, to the axes 905 and 906 of the first and second inductors 903 and 904, respectively. Stated another way, opposite sides 903a and 903b of the first inductor 903 are parallel to one another and are at the acute angle α relative to the wires 911. Likewise, opposite sides 904a and 904b of the second inductor 904 are parallel to one another and are at the acute angle α relative to the wires 911. Ends of the wires 911 are connected to a common electrical ground structure 912.

The value of α is typically 45°, but ranges from about 30° to about 60°. Electrical currents flowing in the respective coils that comprise the first and second inductors 903 and 904 cause magnetic fluxes, B1 and B2, to be generated, respectively. The respective magnetic fluxes B1 and B2 are parallel to the axes 905 and 906, respectively. The wires 911 are at the acute angle, α, to the magnetic fluxes B1 and B2, respectively. With respect to EMI shielding effectiveness, assuming that typical bond wires with a pitch of about 250 microns are used, and assuming frequencies ranging from 1.9 GHz to 2.5 GHz, the compartment EMI shield 910 has an EMI shielding effectiveness that is about the same as that of the compartment EMI shield 510 shown in FIG. 5 and provides about a 5 dB improvement over the compartment EMI shield 410 shown in FIGS. 4A and 4B.

Figure 10:
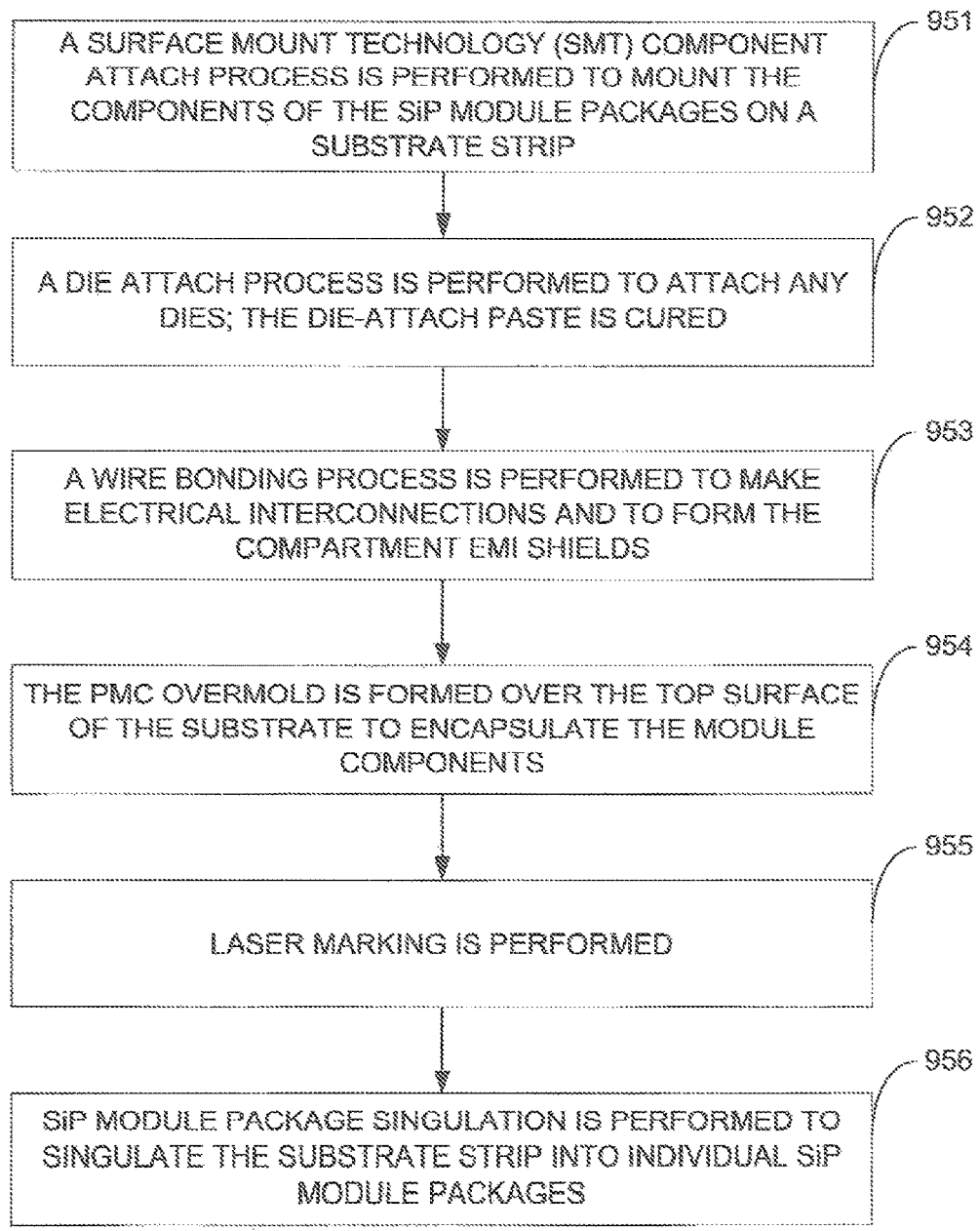
FIG. 10 illustrates a flow diagram corresponding to the method of forming the compartment EMI shield in accordance with an exemplary embodiment.

FIG. 10 illustrates a flow diagram corresponding to the method of forming the compartment EMI shield in accordance with an exemplary embodiment. In accordance with this exemplary embodiment, the compartment EMI shield is formed as part of the known wire bonding process that is performed to interconnect electrical elements when making an SiP module package. For clarity and in the interest of brevity, some conventional process steps may be omitted.

The components that will make up the SiP package modules are mounted on a substrate strip using known surface mount technology (SMT) processes and tools, as indicated by block 951. Any semiconductor dies that need to be mounted by a known die-attach process are then mounted on the substrate strip and the die-attach paste is cured, as indicated by block 952. The processes represented by blocks 951 and 952 are known processes that are currently performed in making SiP module packages.

A known wire bonding process is then performed to make electrical interconnections and to form the compartment EMI shields over the circuitry, as indicated by block 953. Each SiP module package may have more than one block of circuitry, and each block of circuitry may have its own compartment EMI shield. In some cases, however, it may not be necessary to provide every block of circuitry with its own compartment EMI shield.

It should be noted that by forming the compartment EMI shields as part of the wire bonding process, the SiP module package manufacturing process does not have to be altered to incorporate a separate process for forming the compartment EMI shields. Therefore, no capital investment is needed (e.g., retooling) to form the compartment EMI shields. It should also be noted that it is not necessary to use to same gauge bonding wire for the electrical interconnections and for the compartment EMI shields. The guage of wire that is used for this purpose may depend on a variety of factors, including, for example, the targeted shielding efficiency for the frequencies of interest and cost considerations.

After the wire bonding process has been performed, a known PMC over-molding process is performed to form the PMCs of the SiP module packages, as indicated by block 954. After the PMCs have been formed, any laser markings that are needed are formed on the PMCs using a known laser marking process, as indicated by block 955. The populated substrate strip with the PMCs is then singulated into the individual SiP module packages, as indicated by block 956.

Figure 11:
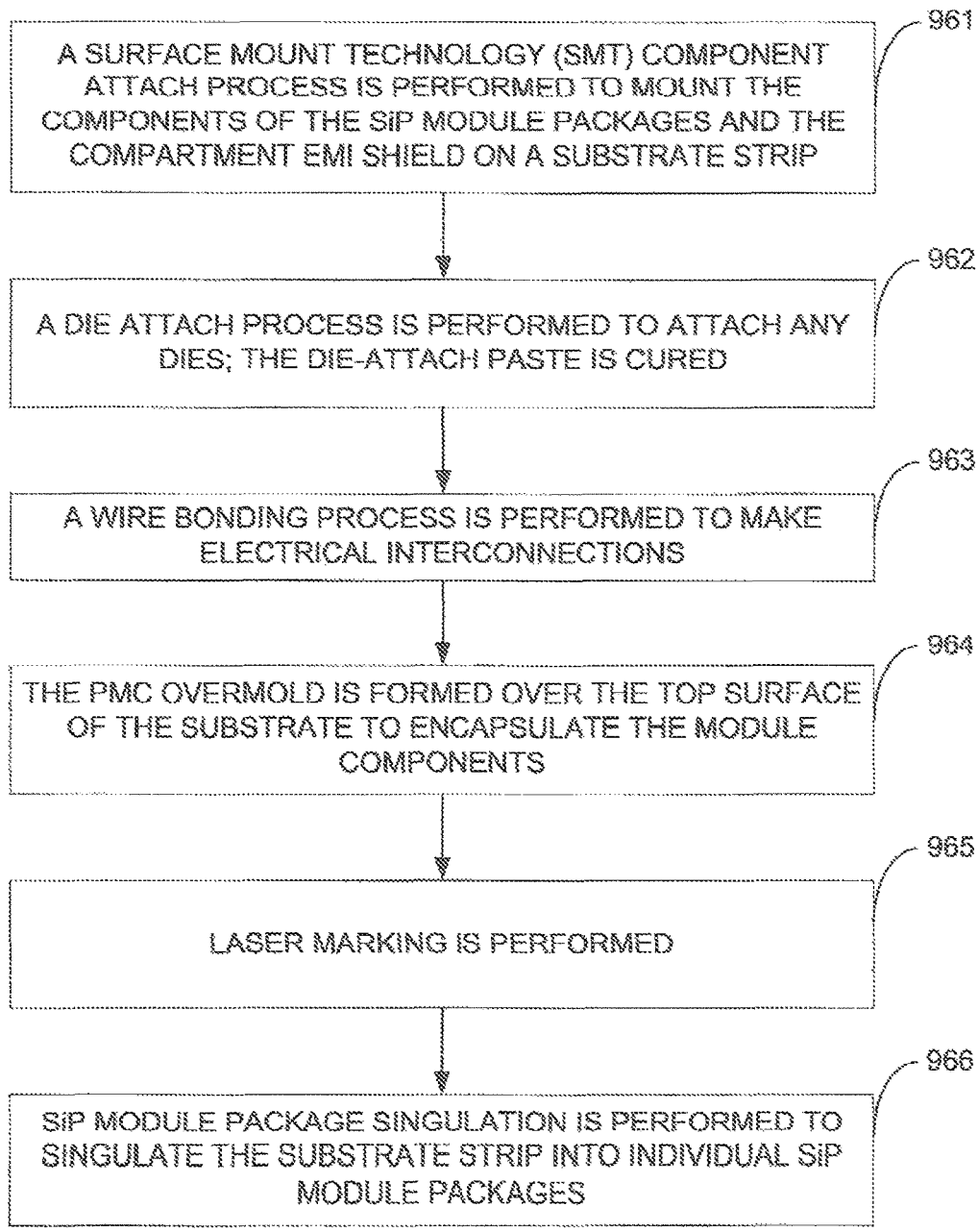
FIG. 11 illustrates a flow diagram corresponding to the method of forming the compartment EMI shield in accordance with another exemplary embodiment.

FIG. 11 illustrates a flow diagram corresponding to the method of forming the compartment EMI shield in accordance with another exemplary embodiment. In accordance with this exemplary embodiment, the compartment EMI shield is pre-formed in a separate process and is attached during the SMT component mounting process. The components that will make up the SiP package modules and the compartment EMI shields are mounted on a substrate strip using known SMT processes and tools, as indicated by block 961. Any suitable process may be used to make the compartment EMI shields.

A known die-attach process is used to mount any semiconductor dies that are needed and the die-attach paste is cured, as indicated by block 962. A known wire bonding process is then performed to make electrical interconnections, as indicated by block 963. After the wire bonding process has been performed, the PMC over-molding process is performed to form the PMCs of the SiP module packages, as indicated by block 964. After the PMCs have been formed, any laser markings that are needed are formed on the PMCs, as indicated by block 965. The populated substrate strip is then singulated into the individual SiP module packages, as indicated by block 966.

The electrical components 103, 104, 203, 204, 303, 304, 403, 404, 603, 604, 803, 804 may be passive electrical components (e.g., inductors, capacitors and resistors), active electrical components (e.g., transistors and amplifiers) or IC chips or dies. In the case of an IC chip or die, the component may be, for example, a power amplifier (PA) or a low-noise amplifier (LNA). In some embodiments, one or more of these electrical components forms a radio frequency (RF) block and the compartment EMI shield is used to reduce EMI emissions from the RF block. The SiP module packages described herein are typically, but not necessarily, incorporated into a wireless device or a wireless communications system, such as a smart phone, for example.

It should be noted that although the illustrative embodiments have been described with reference to a few illustrative embodiments for the purpose of demonstrating the principles and concepts of the invention. Persons of skill in the art will understand how the principles and concepts of the invention can be applied to other embodiments not explicitly described herein. For example, while the compartment EMI shields and the functional blocks with which they are used are shown and described herein as being rectangular in shape, they can have virtually any desired shape. It should also be noted that the circuits and method described above with reference to FIGS. 1-11 are merely examples of suitable circuit configurations and methods that demonstrate the principles and concepts of the invention. As will be understood by those skilled in the art in view of the description being provided herein, many modifications may be made to the embodiments described herein while still achieving the goals of the invention, and all such modifications are within the scope of the invention.

What is claimed is:

1. A system module package comprising:
a substrate;
circuitry comprising at least one electrical component mounted over a surface of the substrate;
a common electrical ground structure disposed on the surface of the substrate, the common electrical ground structure comprising at least first and second portions, wherein the first portion and the second portion of the common electrical ground structure provide a unitary elongated conductive strip; and
a compartment electromagnetic interference (EMI) shield, the compartment EMI shield surrounding and extending over at least one portion of the circuitry, the compartment EMI shield comprising at least a first set of bond wires, each wire having a first length that extends over and is spaced apart from said at least one electrical component and having second and third lengths that extend from opposite ends of the respective first length and connect to the common electrical ground structure, the first lengths being substantially parallel to one another and being substantially parallel to a plane in which the surface of the substrate lies, the compartment EMI shield attenuating a frequency or frequency range of interest.

2. The system module package of claim 1, wherein the first portion of the common electrical ground structure is arranged in a first direction, and the second portion of the common electrical ground structure is arranged in a second direction.

3. The system module package of claim 2, wherein the first length of the first set of bond wires is arranged in a third direction that forms an acute angle relative to the first direction.

4. The system module package of claim 3, wherein:
the at least one portion of the electrical component comprises an inductor generating a first magnetic flux in a fourth direction when electrical current flows through the inductor; and
the fourth direction forms an acute angle relative to the third direction.

5. The system module package of claim 4, wherein the fourth direction is orthogonal to one of the first direction and the second direction.

6. The system module package of claim 2, wherein the first direction and the second direction are orthogonal to each other.

7. The system module package of claim 2, wherein the first direction and the second direction are parallel to each other.

8. The system module package of claim 7, wherein the compartment EMI shield further comprising a plurality of edge shield wires arranged linearly along one edge of the compartment EMI shield so as to attenuate the frequency or frequency range of interest, each of the plurality of edge shield wires comprises a first length that is parallel to the first length of the first set of bond wires and further comprises second and third lengths that extend from opposite ends of the respective first length and connect to the common electrical ground structure.

9. The system module package of claim 8, wherein the first length of the first set of bond wires comprises a first average length, and wherein the sum of the first length of the plurality of edge shield wires is less than the first average length.

10. The system module package of claim 1 further comprising a bent bond wire such that a first end and a second end of the bent bond wire being connected to the common electrical ground structure, and a top bent portion being distanced away from the common electrical ground structure, wherein:
the first set of bond wires comprises a first bond wire having a first end connected to a first position of the common electrical ground structure;
the first set of bond wires comprises a second bond wire having a first end connected to a second position of the common electrical ground structure; and
the first end of the bent bond wire is connected to a third position in between the first position and the second position of the common electrical ground structure.

11. The system module package of claim 10, wherein the second end of the bent bond wire is connected to a fourth position approximating the first position of the common electrical ground structure.

12. The system module package of claim 10 further comprising at least one additional bent bond wire, the bent bond wire and the at least one additional bent bond wire form a wire fence along the common electrical ground structure.

13. The system module package of claim 10, wherein:
the first length of the first set of bond wires is positioned approximately at a first distance away from the surface of the substrate;
the top bent portion of the bent bond wire is approximately at a second distance away from the surface of the substrate; and
the second distance is less than the first distance.

14. The system module package of claim 1, the common electrical ground structure further comprising a third portion and a fourth portion, wherein the first portion, the second portion, the third portion and the fourth portion of the common electrical ground structure provide the unitary elongated conductive strip.

15. A wireless communication device comprising:
a substrate;
at least a first electrical component mounted on a surface of the substrate;
an electrical ground structure;
a second electrical component mounted on the surface of the substrate, wherein the first electrical component is arranged in a first direction, and the second electrical component is arranged in a second direction on the surface of the substrate; and
at least first and second bond wires, each of the at least first and second bond wires has a body portion that extends substantially in parallel to the surface of the substrate and over at least a portion of the first electrical component, wherein; each of the first and second bond wires comprises first and second ends that are connected to the electrical ground structure; and the at least first and second bond wires are spaced apart by a gap that attenuates a frequency or frequency range of interest so as to form a compartment electromagnetic interference (EMI) shield over the at least a portion of the first electrical component; and the at least first and second bond wires extend over at least a portion of the first and second electrical components.

16. The wireless communication device of claim 15, wherein:
the first electrical component comprises a first side that is arranged in a first direction; and
the body portion of the first bond wire is arranged in a second direction that forms a first acute angle relative to the first direction.

17. The wireless communication device of claim 16, wherein the body portion of the second bond wire is arranged in a third direction that forms a second acute angle relative to the first direction.

18. A wireless communication device comprising:
a substrate;
at least a first electrical component mounted on a surface of the substrate;
an electrical ground structure; and
at least first and second bond wires, each of the at least first and second bond wires has a body portion that extends substantially in parallel to the surface of the substrate and over at least a portion of the first electrical component, and wherein each of the first and second bond wires comprises first and second ends that are connected to the electrical ground structure and the at least first and second bond wires are spaced apart by a gap that attenuates a frequency or frequency range of interest so as to form a compartment electromagnetic interference (EMI) shield over the at least a portion of the first electrical component, wherein:
the compartment EMI shield further comprising a plurality of edge shield wires arranged linearly along one edge of the compartment EMI shield so as to attenuate the frequency or frequency range of interest;
each of the plurality of edge shield wires comprises a first length that is parallel to the body portion of the at least first and second bond wires and further comprises second and third lengths that extend from opposite ends of the respective first length and connect to the electrical ground structure; and
adjacent edge shield wires are separated by a spacing, and wherein the frequency or frequency range of interest is attenuated at least in part by the spacing between adjacent edge shield wires.

19. The wireless communication device of claim 18, wherein:
the first electrical component comprises a first side that is arranged in a first direction; and
the body portion of the first bond wire is arranged in a second direction that forms a first acute angle relative to the first direction.

20. The wireless communication device of claim 19, wherein the body portion of the second bond wire is arranged in a third direction that forms a second acute angle relative to the first direction.

* * * * *